United States Patent
Davis et al.

(10) Patent No.: US 6,923,878 B2
(45) Date of Patent: Aug. 2, 2005

(54) SURFACE MOUNT ASSEMBLY SYSTEM WITH INTEGRAL LABEL FEEDER

(75) Inventors: Peter Davis, Santa Cruz, CA (US); Richard Howe, Brockport, NY (US); David W. Lyndaker, Middleport, NY (US); Scott Proctor, Brockport, NY (US)

(73) Assignee: Delaware Capital Formation, Inc., Wilmington, DE (US)

( * ) Notice: Subject to any disclaimer, the term of this patent is extended or adjusted under 35 U.S.C. 154(b) by 0 days.

(21) Appl. No.: 10/722,619

(22) Filed: Nov. 26, 2003

(65) Prior Publication Data

US 2004/0074582 A1 Apr. 22, 2004

Related U.S. Application Data

(63) Continuation of application No. 09/550,030, filed on Apr. 14, 2000, which is a continuation-in-part of application No. 09/028,790, filed on Feb. 24, 1998.

(51) Int. Cl.[7] .............................. B65C 9/26; B65C 9/40; B65C 9/18; H05K 13/00
(52) U.S. Cl. ........................ 156/64; 156/351; 156/363; 156/541; 156/542; 156/556; 156/DIG. 37; 156/DIG. 44
(58) Field of Search .......................... 156/64, 350, 363, 156/539–542, 556, 344, 384, 584; 221/10, 22; 226/5, 8, 115; 29/700, 709, 740, 782

(56) References Cited

U.S. PATENT DOCUMENTS

| | | |
|---|---|---|
| 3,428,509 A | 2/1969 | Messmer |
| 4,025,067 A | 5/1977 | Schlacht |
| 4,267,006 A | 5/1981 | Karn et al. |
| 4,402,424 A | 9/1983 | Mattix |
| 4,411,349 A | 10/1983 | Stedman et al. |
| 4,618,392 A * | 10/1986 | Uchimura et al. .......... 156/384 |
| 4,717,059 A | 1/1988 | Takahashi |
| 4,769,103 A | 9/1988 | Koike et al. |
| 4,813,571 A * | 3/1989 | Slagter ........................ 221/13 |
| 5,342,461 A | 8/1994 | Murphy |
| 5,370,754 A | 12/1994 | Soloman |
| 5,399,228 A * | 3/1995 | Schroeder et al. .......... 156/542 |
| 5,419,802 A * | 5/1995 | Nakatsuka et al. ......... 156/584 |
| 5,540,795 A * | 7/1996 | Franklin et al. ............... 156/64 |

(Continued)

FOREIGN PATENT DOCUMENTS

| | | | |
|---|---|---|---|
| EP | 0701944 A2 | 3/1996 | |
| JP | 11011446 A * | 1/1999 | ............. B65C/9/18 |

*Primary Examiner*—Sue A. Purvis
(74) *Attorney, Agent, or Firm*—Basch & Nickerson LLP; Duane C. Basch

(57) ABSTRACT

The present invention is a method and apparatus conveying a roll of liner stock bearing removably adhered components such as labels. The liner is pulled through the feeder by a capstan drive having opposed fluted nip rollers driven by a stepper motor. Advance of the stepper motor is controlled by a programmable electronic controller. The linered labels are led through a tensioner and around an acute-angle peeler edge which separates the labels from the liner. The peeling action advances a label onto a platform comprising a bed of rollers having an inherently low-adherence surface. Preferably the rollers are undercut to form circumferential ridges and reduce the surface area in contact with the label adhesive and to minimize adherence thereto. When peeling of a label is completed, the label has been advanced onto the roller bed to precisely the proper location for acquisition by a pick-and-place machine. The presence of a label on the platform is confirmed by a sensor that signals the controller to stop further liner advance. The signal also serves to reset the feeder for advance of the next label after the first label is picked from the roller bed.

12 Claims, 10 Drawing Sheets

U.S. PATENT DOCUMENTS

| | | |
|---|---|---|
| 5,630,270 A | 5/1997 | O'Malley |
| 5,642,666 A | 7/1997 | Petteruti et al. |
| 5,713,125 A * | 2/1998 | Watanabe et al. .............. 29/833 |
| 5,783,029 A | 7/1998 | Stettner et al. |
| 5,937,497 A * | 8/1999 | Robinson ................... 29/426.3 |
| 5,984,176 A * | 11/1999 | Koda et al. ................. 235/376 |
| 6,027,019 A * | 2/2000 | Kou ............................ 235/375 |
| 6,080,250 A | 6/2000 | Urban et al. |
| 6,109,472 A | 8/2000 | Gibier |
| 2002/0167801 A1 * | 11/2002 | Suhara et al. ............... 361/728 |
| 2003/0121607 A1 | 7/2003 | Davis et al. |

* cited by examiner

SURFACE MOUNT ASSEMBLY SYSTEM WITH INTEGRAL LABEL FEEDER

This application is a continuation of pending U.S. application Ser. No. 09/550,030, filed Apr. 14, 2000 by Peter Davis et al., which is a continuation-in-part of pending U.S. application Ser. No. 09/028,790 for a "LABEL FEEDER," filed Feb. 24, 1998 by Peter Davis et al., the entire contents of which are hereby incorporated by reference.

This invention relates generally to a method and apparatus for feeding adhesive-backed components in a surface mount assembly system. More particularly, the invention is an apparatus and method for peeling and feeding labels and other thin components, including automatically peeling labels and similar components from liner stock and presenting them sequentially on a non-adherable platform for acquisition, on a non-adhesive side by a vacuum-operated, pick-and-place robotic head.

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND AND SUMMARY OF THE INVENTION

In the manufacture of many electronic devices, for example printed circuit boards used in computers and other types of electronic devices, components are assembled onto a frame or printed circuit board (PCB) moving along an assembly line past a linear array of machines, each of which picks a given component from a supply of such components and places it in the proper location and orientation on the frame or board. Surface Mount Technology (SMT) for assembly of printed circuit and other boards typically uses this arrangement. Such machines are known in the art as "pick-and-place" machines or robots and may also be characterized as an end-effector. Typically, each pick-and-place machine is served by a dedicated feeder machine which unwinds a reel of tape containing the given components in sequence at a proper spacing and orientation, and presents each component sequentially for pickup and transfer by a vacuum head of the associated with the end-effector or pick-and-place machine. The components may be loosely attached to the tape by low-tack adhesive on the tape surface or may reside in shallow depressions in the tape, which depressions may be covered by a second, removable tape. Advance of the feeder tape drive is synchronized with the advance of the main assembly line and the cycle of the pick-and-place machine to present each component to the pick-and-place machine precisely where it is needed and when it is needed, and to do so with a high degree of positional and orientational accuracy. To meet these stringent requirements reliably, the feeder tape may be provided with perforations along one or both edges and may be driven by an intermittent sprocket advance mechanism. An example of such a tape feeder machine is the Model MPFO2, available from Hover-Davis, Inc., Spencerport, N.Y. USA.

Heretofore, the application of labels to surface mount and printed circuit assemblies was generally accomplished by a manual operation, whereby an operator placed the label on a printed circuit board. In some situations a robotic operation, at a station subsequent to the assembly operation, was used to place labels on the surface of the completed PCB assemblies. However, as will be appreciated, such additional steps are costly either in direct labor or as capital investments for automation.

Accordingly in SMT and similar applications, it is desirable to pick and place an adhesive-backed label onto a circuit board or other substrate in the same manner that is used for conventional SMT components. Moreover, it is a significant commercial advantage if the equipment to feed labels for pickup by conventional pick-and-place equipment is adaptable to operate in the same equipment and fashion as the component feeding devices currently used—thereby avoiding the need for modifications or additions to existing SMT assembly equipment. It should be appreciated that the adhesive or tacky force of a label to be used on a printed circuit board is significant as such labels are frequently required to remain affixed while the printed circuit board is exposed to extreme environments. For example, the board and attached label may pass through a wave soldering environment or a re-flow oven.

The discrete labels are commonly available in roll form, being peelably attached to a continuous ribbon or web of sacrificial backing material known generally as label liner. A conventional tape feeder machine is neither suited nor adaptable to providing peeled labels ready for picking because a) it is not capable of peeling such a label from a continuous backing liner, b) a peeled label in presentation position for acquisition by a pick-and-place machine will adhere unacceptably to the tape, and c) the label must be positioned in a close-tolerance, consistent manner in order to allow for accurate retrieval and placement by the pick and place machine in the same manner as components are retrieved and placed. Further, commonly available linered label stock is not perforated and thus cannot be advanced incrementally and reliably if simply substituted for the tape in a tape feeder machine.

Machines are known in the label printing art that can remove adhesive-backed labels from label liner stock and can present them sequentially for use. See, for example, U.S. Pat. No. 4,025,067 issued May 24, 1977 to Schlacht; U.S. Pat. No. 4,267,006 issued May 12, 1981 to Karn; U.S. Pat. No. 4,717,059 issued Jan. 5, 1988 to Takahashi et al.; U.S. Pat. No. 4,769,103 issued Sep. 6, 1988 to Koike et al.; and U.S. Pat. No. 5,642,666 issued Jul. 1, 1997 to Petteruti et al. Typically, such machines present a peeled label as partially adhered to, and partially projecting unsupported from, a ridged feeder lip to facilitate access to the adhesive side of the label for ready transfer or direct application to a substrate. Peeled labels may exhibit substantial curl, and thus the spatial location of such a label may not be precisely controlled. Known lips of linered label printers, therefore, are inherently inadequate to meet the high-tolerance label positioning requirements of an automatic pick-and-place machine.

Thus, there is a need for a feeder apparatus which can automatically convey a roll of linered label stock (or similar components), sequentially peel adhesive-backed labels from the liner, and present the labels sequentially with their adhesive sides toward a non-adherable platform for picking by attachment to their non-adhesive sides. The labels must be presented to the picker with a high degree of positional, orientational, and timing accuracy (i.e. close tolerances) and must be held substantially planar on the platform.

It is a principal object of the invention to provide a label feeding method and apparatus that can peel and present an adhesive-backed label for acquisition by a pick-and-place machine or robot in a conventional surface mount assembly system. It is a further object of the invention to provide a label feeder that can present an adhesive-backed label with a high degree of positional, orientational, and timing accuracy. It is yet another object of the invention to provide a platform for adhesive-backed materials to which such materials may not substantially adhere, from which such materials are easily lifted, and upon which such materials are maintained in a substantially planar form.

Briefly described, a label feeder embodying the invention has a web path including apparatus for mounting, unwinding, and conveying a roll of liner stock bearing a sequential plurality of removably adhered labels on a surface thereof. The label liner is pulled through the feeder by a driven take-up which preferably includes a capstan drive having opposed nip rollers, preferably axially fluted and meshed, driven by a motor, preferably a stepper motor. Advance of the stepper motor is controlled by a programmable electronic controller to advance the liner. The linered labels are led through a tensioner and around an acute-angle peeler edge that separates the labels from the liner in known fashion, the label stock having sufficient beam strength, and the adhesive having insufficient tack (adhesive force) to maintain adherence to the liner through such an abrupt turn in the web path. The peeling action advances the label onto and along a platform preferably comprising a bed of rollers formed of, or coated with, an inherently low-adherence material such as a fluoropolymer. When peeling of a label is completed, the label has been advanced onto the roller bed to precisely the proper location for acquisition by a pick-and-place machine. The proper location of a peeled label on the platform is confirmed by a sensor that signals the controller to stop the liner advance. The signal also serves to reset the apparatus for advance of the next label after the present label is picked from the roller bed.

In accordance with the present invention, there is provided a surface mount assembly system, including: means for presenting a substrate to be populated with one or more components on a surface thereof; a plurality of component feeders operatively associated with the surface mount assembly system, for presenting components at respective component pick-up locations; a robot for retrieving the components from said component feeders at the respective pick-up locations and placing the components on the surface of the printed circuit board; wherein at least one of said component feeders is a label feeder for feeding an adhesive-backed label on a label liner to the respective pick-up location for retrieval by the robot, and where said label feeder comprises a frame, a separator presenting an edge underlying the label liner for separating the label from the label liner; and a roller platform including a plurality of rollers disposed on said frame and facing the adhesive backing side of the label for receiving and supporting the adhesive side thereof, wherein at least two of said plurality of rollers include a plurality of circumferential ridges for supporting the label while reducing the adhesion of the label to the rollers.

In accordance with another aspect of the present invention, there is provided a label feeder for transporting an adhesive-backed label on a label liner, separating the label from the label liner, and presenting the separated label for retrieval, comprising: a frame; a separator disposed on said frame and presenting an edge underlying the label liner for separating the label from a label liner with the label adhesive backing side facing toward the liner; and a roller platform including a plurality of rollers disposed on said frame and facing the adhesive backing side of the label for receiving and supporting said separated label on the adhesive surface thereof, wherein at least two of said plurality of rollers include a plurality of circumferential ridges for supporting the label.

In accordance with another aspect of the present invention, there is provided a label feeder for separating an adhesive-backed label from a label liner and presenting the peeled label for acquisition by a pick-and-place machine, comprising: a frame; a peeler edge disposed on said frame for peeling a label from a label liner; a roller platform comprising a plurality of rollers disposed on said frame for receiving, conveying, and supporting said peeled label, at least one of said rollers being undercut over a portion of its surface to provide a plurality of circumferential ridges having a diameter greater than the diameter of said undercut portion, at least one of said rollers being substantially non-adherable to said adhesive-backed label over at least a portion of said circumferential ridges contactable with said adhesive; a web path along said frame passing around said peeler edge and past said platform along which said label liner is movable; a tensioner in said web path ahead of said peeler edge; drive means for pulling said label liner along said web path around said peeler edge, said drive means including a pair of nip rollers disposed respectively one on either side of said web path to engage said label liner therebetween, at least one of said nip rollers being driven; a sensor for sensing the presence and absence of a peeled label on said platform; and a programmable controller responsive to signals from said sensor for controlling operation of operating elements of said feeder.

In accordance with yet another aspect of the present invention, there is provided a method for providing a peeled, adhesive-backed label from a roll of linered label stock using a path for conveyance of the stock, comprising the steps of: advancing the label stock along said web path using label stock drive means; separating the label from the label liner using a separating edge underlying the label liner; receiving the label on a platform including a plurality of ridged rollers, wherein the adhesive-backed surface of the label contacts the ridges of the rollers; using a sensor, sensing the presence and absence of a separated label on said platform and communicating said presence and absence to said drive means; in response to a label absence signal from said sensor, energizing said drive means to advance the label stock around said separating means to separate a label from said stock; and in response to a label presence signal from said sensor, de-energizing said drive means to arrest further advance of the label stock.

One aspect of the invention deals with a basic problem in the application of labels to printed circuit boards and similar electronic assemblies. Such systems generally employ standardized equipment that interface with pick-and-place robotic machines for the placement of electrical components (e.g., integrated circuits). Traditionally, labels were added or applied either manually or using dedicated labeling systems. An aspect of the present invention is further based on the discovery of a technique that enables the creation of a label feeding apparatus in a form factor compatible with conventional pick-and-place machines, for example, the Fuji IP/QP2 and the Universal GSM. The technique utilizes a linered label stock and a unique label feeder design and positioning platform to present the label in a manner consistent with the presentation of other components to be placed on a surface of the printed circuit board.

The technique described above is advantageous because it efficiently enables the use of a label feeder that may be interchanged with other component-type feeders in a pick-and-place system. The techniques make it unnecessary to have manual label application or a dedicated label-feeding station. As a result of the invention, it is possible to integrate label-feeding technology into component placement equipment.

Figure 1:
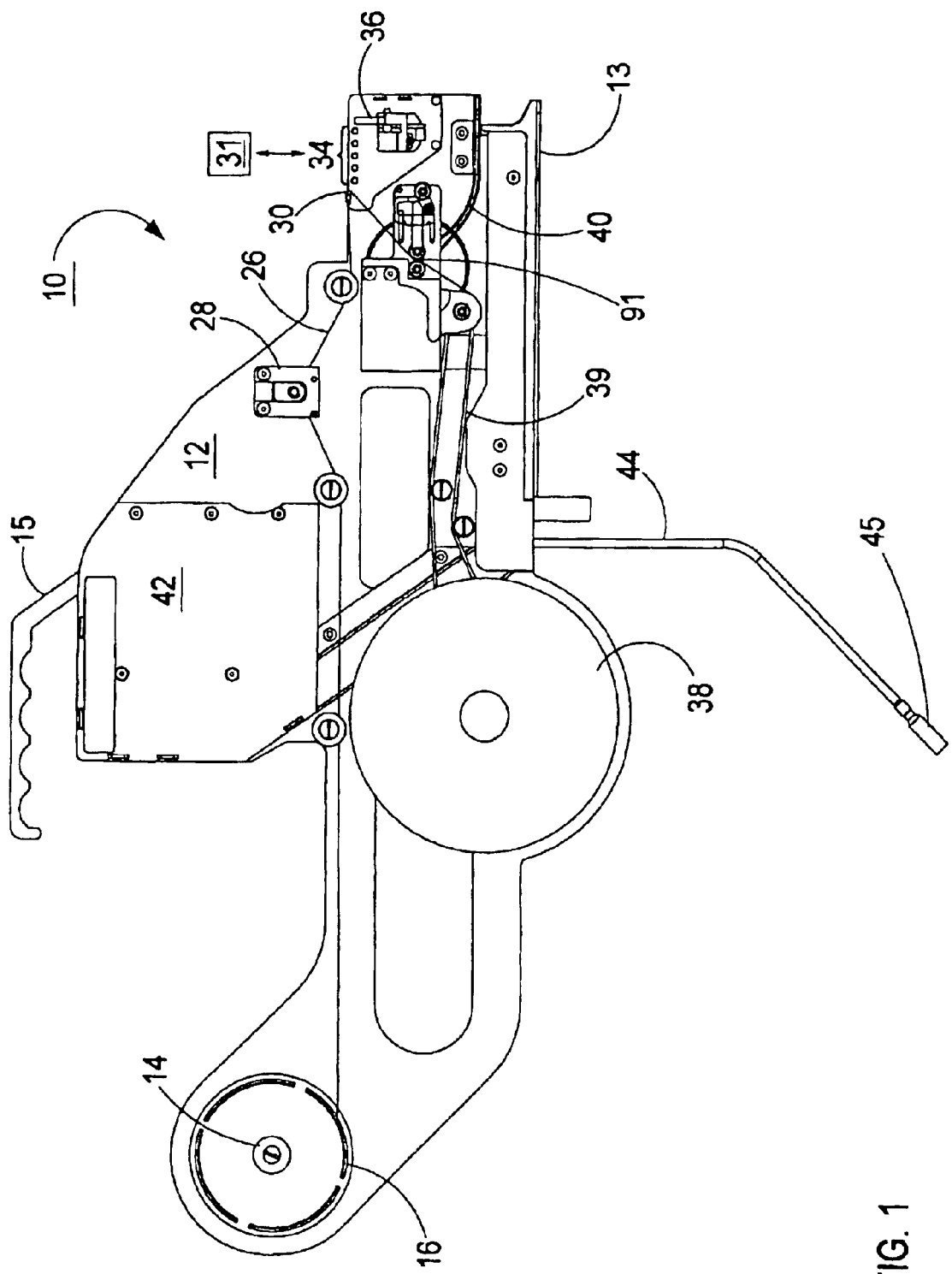
FIG. 1 is a vertical elevational view of a label feeder in accordance with the present invention.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by the appended claims.

DESCRIPTION OF THE PREFERRED EMBODIMENT

For a general understanding of the present invention, reference is made to the drawings. In the drawings, like reference numerals have been used throughout to designate identical elements.

As used herein, the term "label" includes self-adhering, flexible labels that are available in roll stock, as well as other similarly characterized components that may be temporarily placed or adhered to a self-adhesive backing tape and are suitable for peelable release therefrom. The term label specifically includes other components such as die-electric shields and interposers well known in surface mount technology.

Referring to FIGS. 1 through 4, a label feeder 10 in accordance with the invention has a vertical frame 12, formed preferably from sheet metal stock, for supporting components of the feeder. Frame 12 is provided with a shoe 13 for engagement with a mating fixture (not shown) on a pick-and-place machine (not shown), and a handle 15 for ease in manual transport and installation. It should be understood that a cover is preferably used for shielding the labels and feeder components, and while in use as an element of the feeder, the cover being omitted from these drawings for clarity of presentation. It should be further understood that a label feeder for supplying labels along an assembly line, like other component feeders such as the tape feeders described above, is highly constrained in the assembly line space allotted to it. For example, in some applications a feeder may have a width 17 of no more than 40 mm. Component feeders, therefore, are commonly configured with the principal mechanical elements disposed in a common vertical plane.

Unwinder 14 can accept for unwinding a roll of label liner 16 to which are removably adhered a sequence of adhesive-backed labels 18 which typically have been pre-printed with indicia 20 and wound up on a separate label printing machine (not shown). Alternatively, it is possible that blank labels may be used and printed as they are advanced to for retrieval. Suitable linered label stock is available from, for example, BRADY USA, NC., Milwaukee, Wis. USA. Such stock is not provided with perforations, and no stock perforations or feeder sprockets are required for conveyance and precision placement of peeled labels in a feeder in accordance with the present invention.

Figure 2:
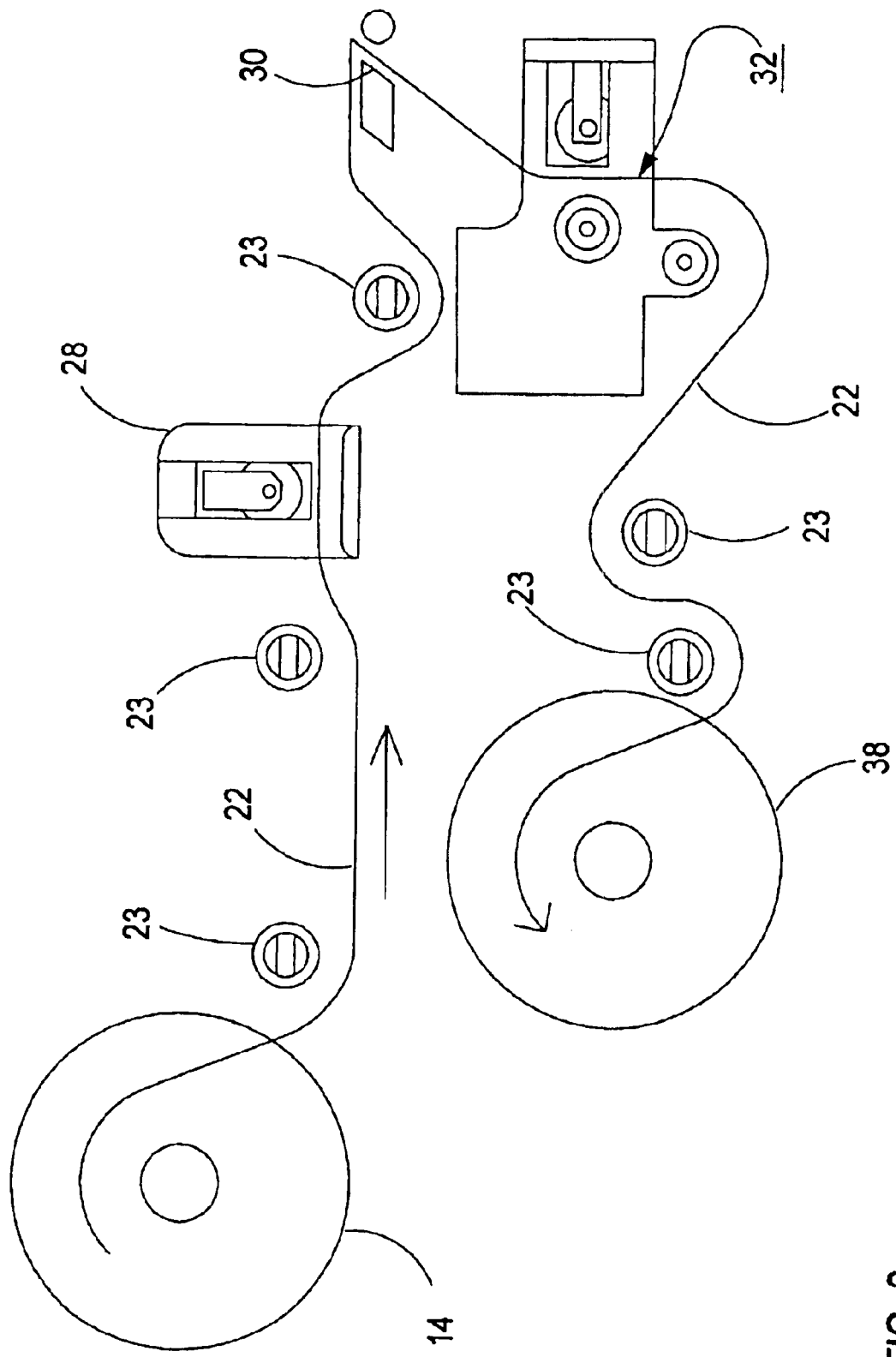
FIG. 2 is a schematic drawing showing the conveyance path of a ribbon of label liner through the label feeder shown in FIG. 1.

Liner 16 is conveyed through feeder 10 along a web path 22, shown schematically in FIG. 2, which may include one or more idler rollers 23 for supporting the web. From unwinder 14, liner 16 having labels 18 adhered to first liner surface 26 is conveyed generally horizontally through a tensioning device 28, around a separator 30 for separating labels from the liner, and through a capstan drive module 32 which pulls the label stock through the upstream portions of web path 22. A platform 34 adjacent to separator 30 supports each peeled label, and a sensor 36 detects the presence or absence of a label on platform 34. These feeder elements are described more fully below. A vertically reciprocating suction head 31 of a pick-and-place machine is disposed in label pick-up relationship with platform 34. For example a suction head on a Fuji IP/QP2 or a Universal GSM system. After exiting capstan drive module 32, spent liner may be wound for disposal by driven winder 38 or may exit feeder 10 directly through exit chute 40. Winder 38 is preferably a tendency take-up winder driven by a low-friction rubber belt 39, the winder serving simply to accumulate in roll form the spent liner discharged by the capstan drive rollers.

A control module contained within a housing 42 mounted on frame 12 is supplied with power and interacts with its pick-and-place customer via pigtail 44 having a conventional pin-type connector 45. The control module includes a programmable controller and associated components for conventionally sequencing and controlling the mechanical and electrical elements of the feeder. The feeder may be started and stopped and the liner may be advanced and reversed manually by an operator via control buttons 46.

Separator 30 may take any convenient shape that suffices to cause a label to separate from a liner and is preferably a wedge-shaped peeler bar. Preferably, separator 30 is provided with an internal angle such that liner 16 is turned sharply through an angle preferably greater than 90° to cause the lead edge of the label 18 to separate from the liner. As the liner continues to be advanced around edge 30, label 18 becomes progressively peeled from liner 16 and ultimately entirely separated therefrom. Until the separation occurs, the label is urged forward by the advancing liner in a linear path away from the edge that is a continuation of the label conveyance direction ahead of peeler edge 30.

Peeling of a label by separator 30 is enhanced by having the liner under tension. Such tension is provided by cooperation between capstan drive module 32, which pulls liner 16 forward around edge 30, and tensioning device 28 that provides drag on liner 16 ahead of edge 30.

Figure 7:
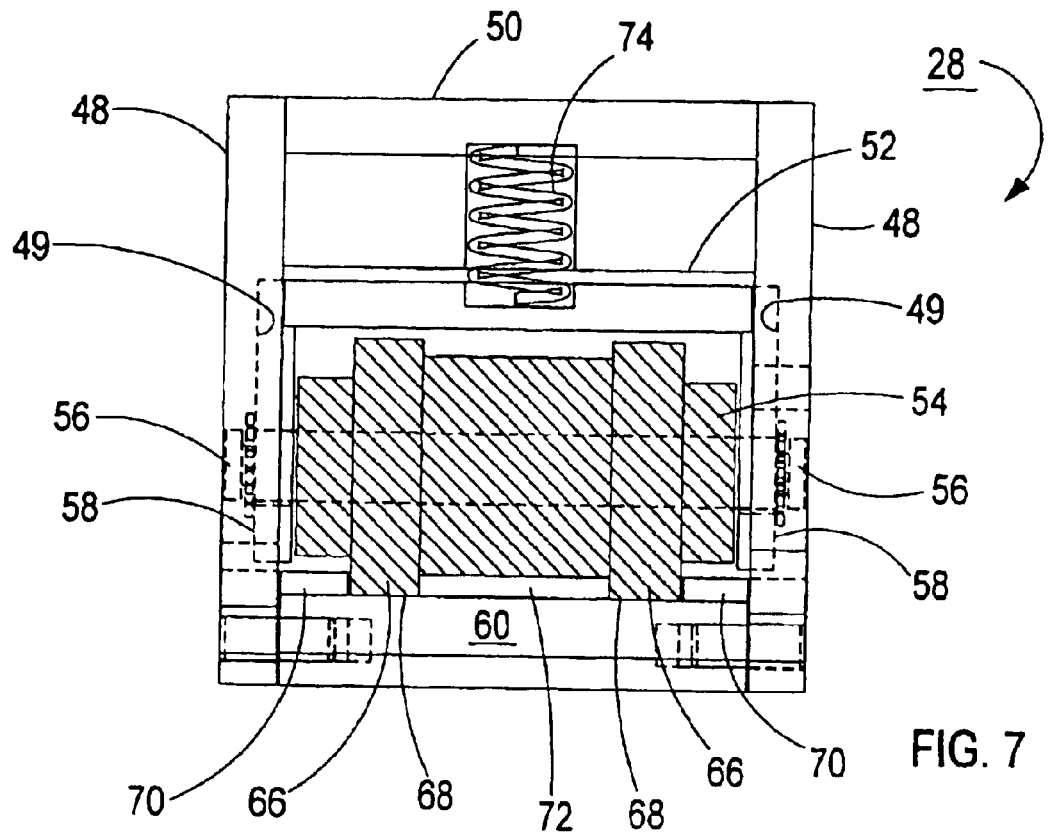
FIGS. 7 and 8 are vertical cross-sectional and side elevational views, respectively, of a web tensioning device which is a component of the feeder shown in FIGS. 1 through 4.
Figure 8:
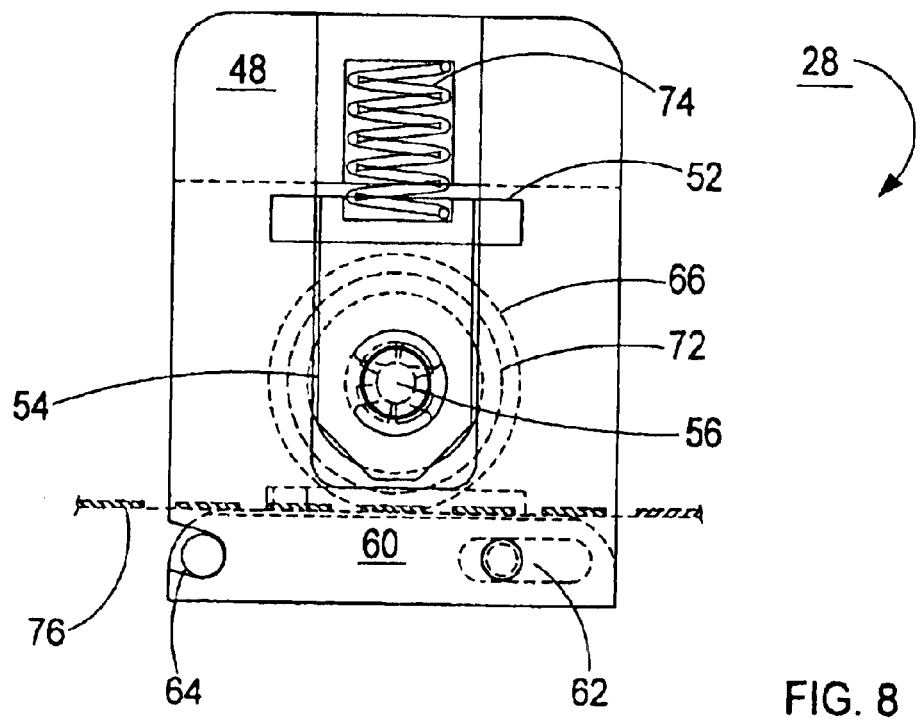

Referring to FIGS. 7 and 8, tensioner 28 has a pair of parallel spaced-apart sidewalls 48 rigidly separated by top 50, each of sidewalls 48 being provided with channels 49 for receiving a U-shaped slidable bearing mount 52. One of the sidewalls is mounted to frame 12 (not shown). A stepped roller 54 is disposed between sidewalls 48 for rotation with shaft 56 that is journalled at opposite ends thereof in bearings or bushings 58 in mount 52. An openable door 60, having a slotted hinge 62 and catch 64, mates with ribs 66 on roller 54 to form nips 68 therebetween when door 60 is in closed position. Door 60 may be opened to relieve the nips and facilitate threading of the liner through tensioner 28 prior to operation of the feeder. Door 60 is provided with guides 70 outboard of ribs 66 for edge-guiding the label liner through the tensioner. Ribs 66 are separated by undercut 72 in roller 54 so that roller 54 bears only on liner 16 outboard of labels 18 and not on the labels themselves. A spring 74 disposed between top 50 and slidable mount 52 urges roller 54 against door 60. The force exerted by spring 74 may be adjustable in known fashion. The frictional resistance between the second surface 76 of liner 16 and door 60, engendered by spring 74, resists passage of liner 16 through tensioner 28, thereby creating tension in the liner between tensioner 28 and the upstream side of peeler edge 30.

Figure 9:
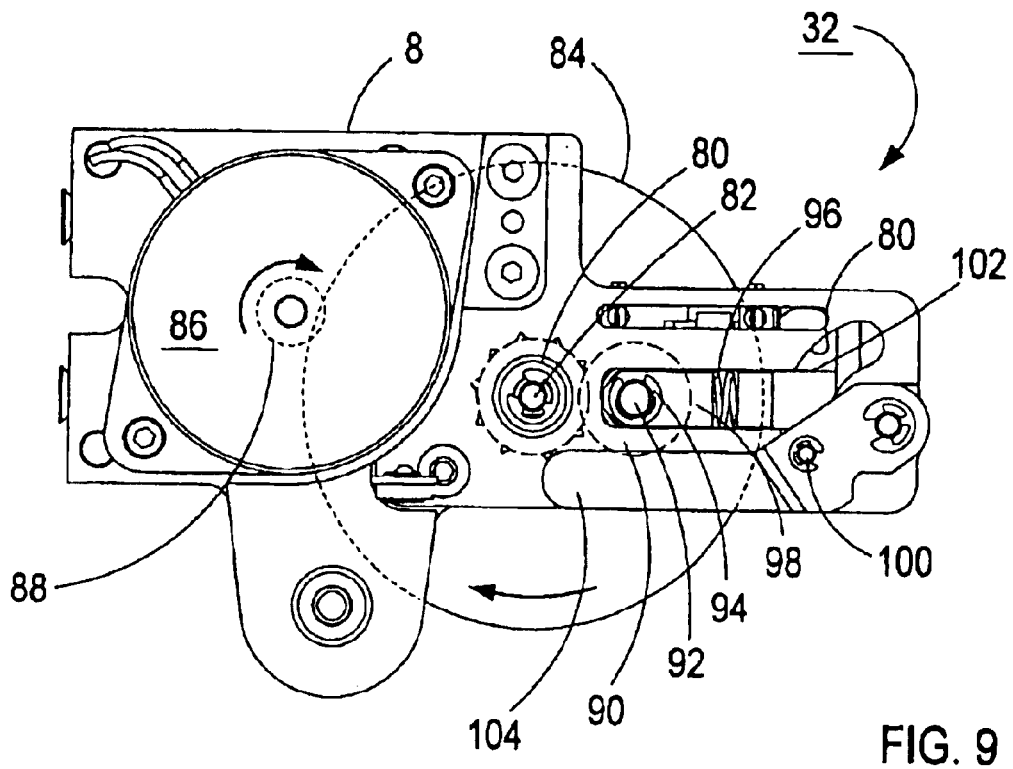
FIGS. 9 and 10 are vertical elevational views of a two-roller capstan drive module for drawing a ribbon of label liner through a feeder, showing the rollers in the closed-nip and opened-nip positions, respectively.
Figure 10:
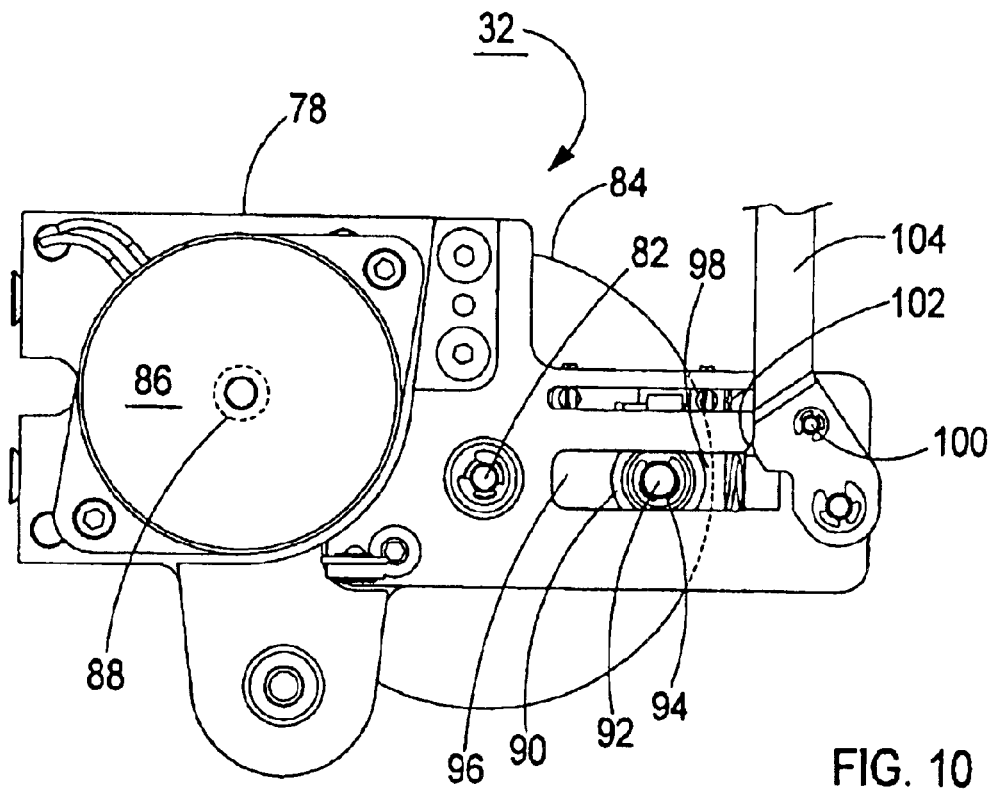

Referring to FIGS. 9 and 10, capstan drive module 32 for drawing the ribbon of label liner through the feeder is provided with a sub-frame 78 for mounting to feeder frame 12. Sub-frame 78 includes two parallel spaced-apart plates. A first capstan roller 80 is fixed on a shaft 82 disposed for rotation between the plates of sub-frame 78. Shaft 82 is provided with first pinion gear 84 for driving roller 80 in a clockwise direction. Motor 86, preferably a stepper motor, is mounted to frame 78 and is provided with a second pinion gear 88 disposed in meshing relationship for driving gear 84. A second capstan roller 90 oriented parallel with first roller 80 is mounted on a shaft 92 that is journalled at opposite ends in bearings 94. The plates of sub-frame 78 are each provided with a slotted opening 96 for receiving a slidable bearing mount 98 that supports bearings 94. Bearing mounts 98 are pivotably connected to a cam follower 100 disposed in a slotted cam 102 in frame 78 and connected to handle 104. The actuation of the handle 104 causes the second capstan roller 90 to approach or retreat from the first capstan roller 80. This permits the nip between the two rollers to be opened for ease of threading the label liner therebetween, as shown in FIG. 10. When closed, as shown in FIG. 9, the capstan drive module provides a two-roller nip drive for drawing the label liner through the upstream elements of the feeder.

Preferably, each of the capstan rollers is provided with axial fluting 106 of the roller surface. As the nipped rollers rotate, the second roller being driven in counter-rotation by nipped contact with the first roller, the liner is crimped by the meshing flutes of the rollers and is positively driven through the roller nip at a significant frictional force. This provides tension in the liner on the downstream side of peeler edge 30 and also permits use of a stepper motor to positively advance the liner by a precise distance for each label. Preferably, the stepper motor and capstan drive rollers are the primary label-metering apparatus of the feeder. This feature can permit precise advance of the label liner without resort to perforations in the liner and sprockets in the feeder drive.

Figure 3:
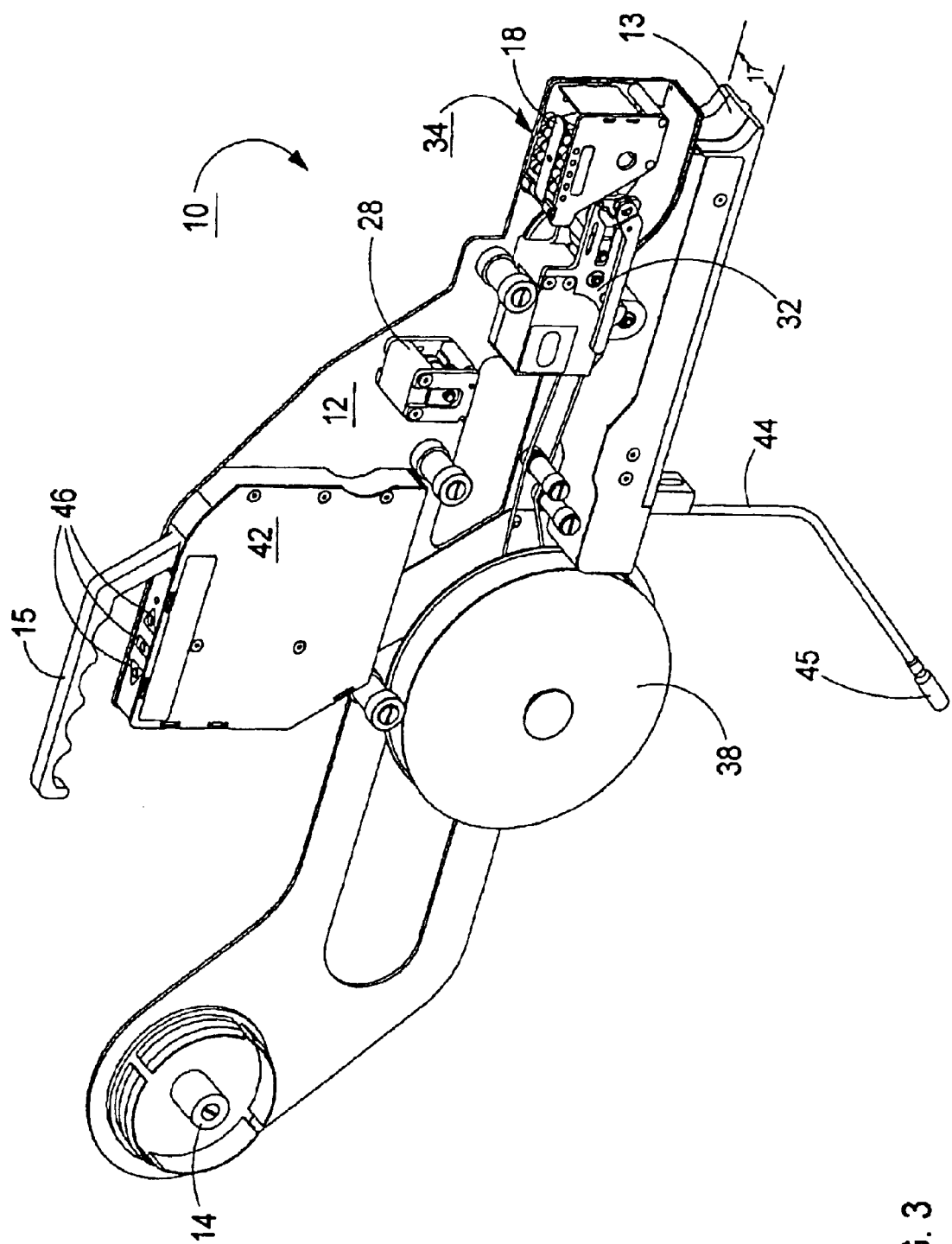
FIG. 3 is an isometric view, partially in cutaway, of the label feeder shown in FIG. 1.
Figure 4:
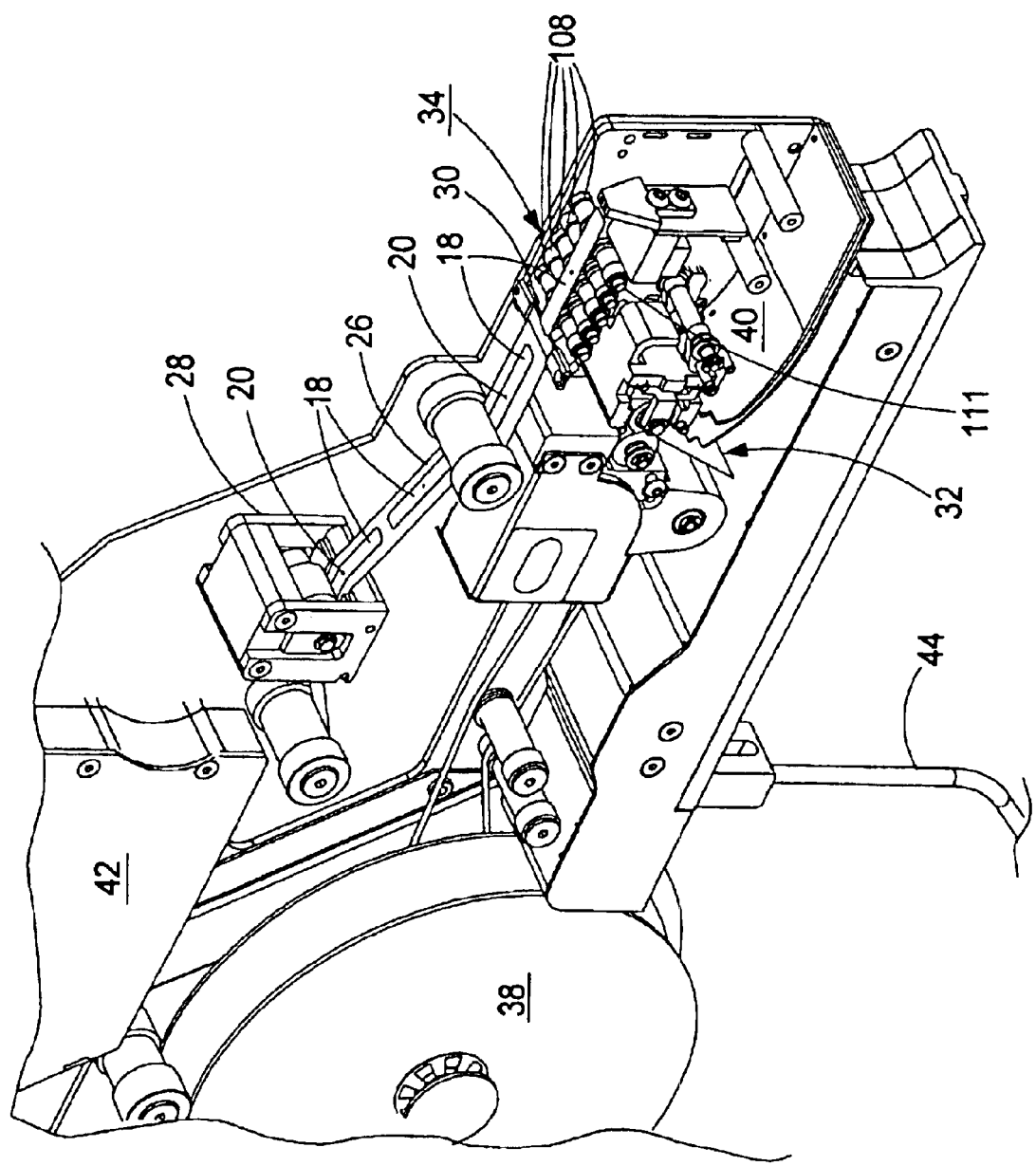
FIG. 4 is an enlarged view of a portion of the label feeder shown in FIG. 3, showing the positions and relationships of components of the drive end of the feeder.

A feature of a label feeder in accordance with the invention is platform 34 for receiving, conveying, and presenting a peeled label, as shown in FIGS. 1, 3, and 4. Preferably, platform 34 includes a plurality of rollers 108 disposed parallel to and in close proximity to one another to form a roller conveyor bed whereby a peeled label may be supported on a portion of its adhesive side at a plurality of locations distributed evenly along its entire width and substantially along its length, the non-adhesive side being unencumbered and presented upwards for ready acquisition by a pick-and-place machine. Such support enhances the feeder's ability to present a peeled label in a substantially planar form. Furthermore, the plurality of rollers are of such a diameter and spacing so as to preferably support only the middle portion of the label, allowing the lead edge thereof to extend past the last roller where it may be sensed from below using an optical sensor 36 as further described below.

In a preferred embodiment of platform 34, it is a feature of each roller 108 that the surface of the roller be substantially non-adherable to the adhesive side of a label. Preferably, any portion of the roller surface for making contact with a label is coated with a dry, cross-linked coating of an inherently low-adhesion material such as, for example, a fluorocarbon polymer. Preferably, the surface area of the roller that is allowed to make contact with a label is reduced by providing a stepped surface 110 to the roller whereby a label is supported by a few, preferably four, narrow circumferential ridges 112 having rounded peripheries 114. In a presently preferred embodiment shown in FIGS. 5A and 6, each ridge is no more than about 0.020 inches wide with sides converging at an included angle of about 26° to a 0.005 inch radius periphery so as to encourage single-point contact between the ridge and the label's adhesive surface. Ridges are spaced at 0.120 inches on center. It will be further appreciated that other ridge profiles may also result in equivalent single-point contact as achieved by the angled and radiused geometry described.

The ridging is not located symmetrically about the middle of the roller but is preferably offset by one-half the pitch of the ridge spacing. When alternate rollers are turned end-for-end during installation in the platform, the tops of the ridges on adjacent rollers are interleaved, providing diagonal as well as linear support along the length of a peeled label.

In a preferred embodiment, it is believed that the adhesion force of the label to the surface of the rollers is appropriately minimized when the total width of the circumferential ridges is in the range of 1–15 percent, and preferably less than 5 percent, of the overall width of the label. Furthermore, while spacing of the circumferential ridges is less critical, it is important that they be spaced so as to adequately support the label across its width, such that the width of each of said plurality of circumferential ridges, at its shoulder, is less than 25 percent of the separation distance between adjacent ridges on the roller.

Rollers 108 may be readily formed by conventional turning from rod stock; for example, stainless steel or glass-filled fluorocarbon polymer, providing rollers wherein the diameter of the ridges is substantially that of the non-relieved areas 116, 118. If desired, however, the ridges can be formed to have a diameter greater than the diameter of areas 116, 118 so that the ridges of adjacent rollers are actually interleaved. When the rollers are formed from metal rod, a subsequent low-adherence coating is preferred, for example, a polyfluoro alkoxy coating, or a fluorocarbon polymer including tetrafluoroethylene (TFE) fluorocarbon polymers or fluorinated ethylene-propylene (FEP) resins (e.g., Dupont Teflon® from E.I. Dupont de Nemours & Company) of up to about 0.002 inches in thickness. When the rollers are formed from fluorocarbon polymer rod or tube stock or other similar highly fluorinated polymers, generally no further treatment is necessary. In a further preferred embodiment of roller 108, an axial bore 109 is provided for receiving a shaft 111 for mounting the roller in platform 34.

Figure 5A:
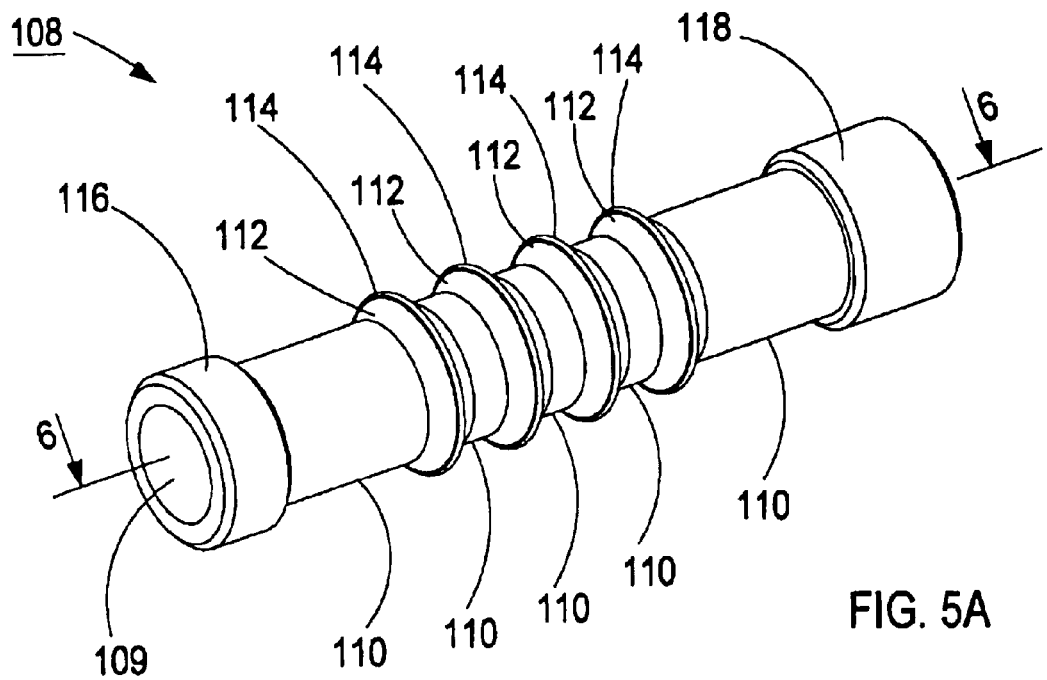
FIGS. 5A and 5B are isometric views of a non-adherable roller that is a component of a roller bed for receiving and presenting a peeled label for picking.
Figure 5B:
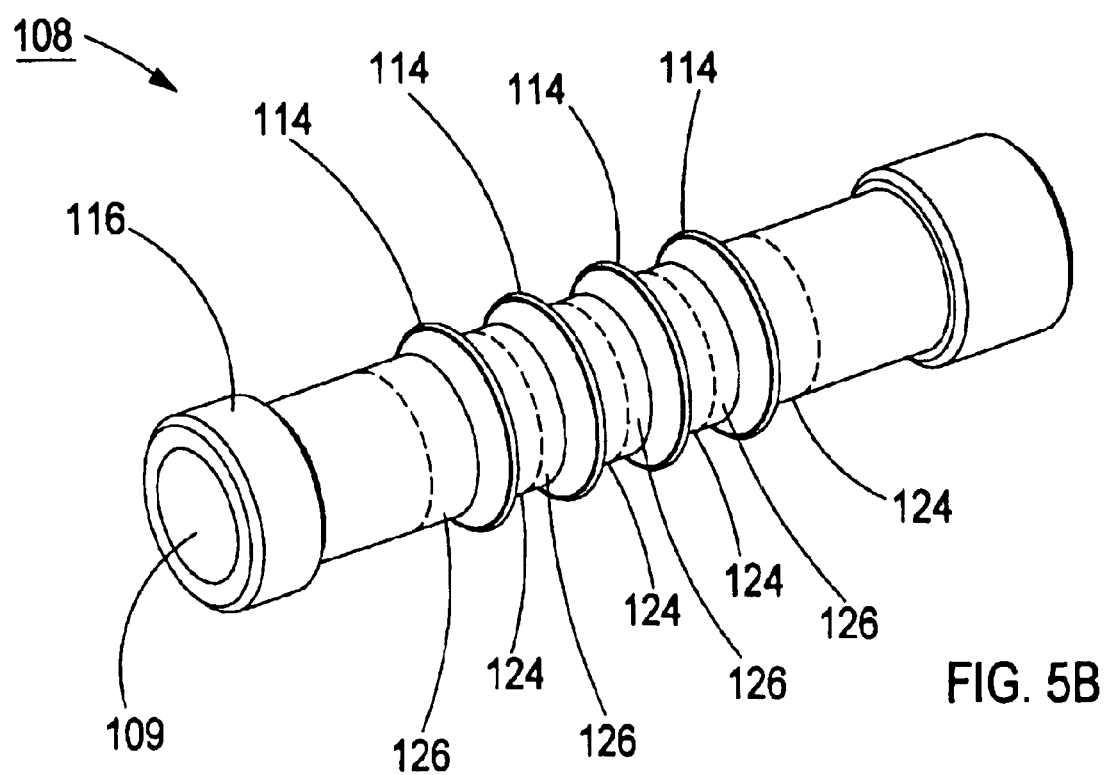

Referring to FIG. 5B, depicted therein is an alternative embodiment for roller 108. In particular, the roller 108 may be comprised of a plurality of ridged rollers 124, each having one or more ridges with rounded peripheries 114 extending from a central location thereof, and each preferably including a recessed shoulder 126 or an associated spacer (not shown) to insure that it is appropriately spaced-apart from an adjacent roller 108b.

Figure 6:
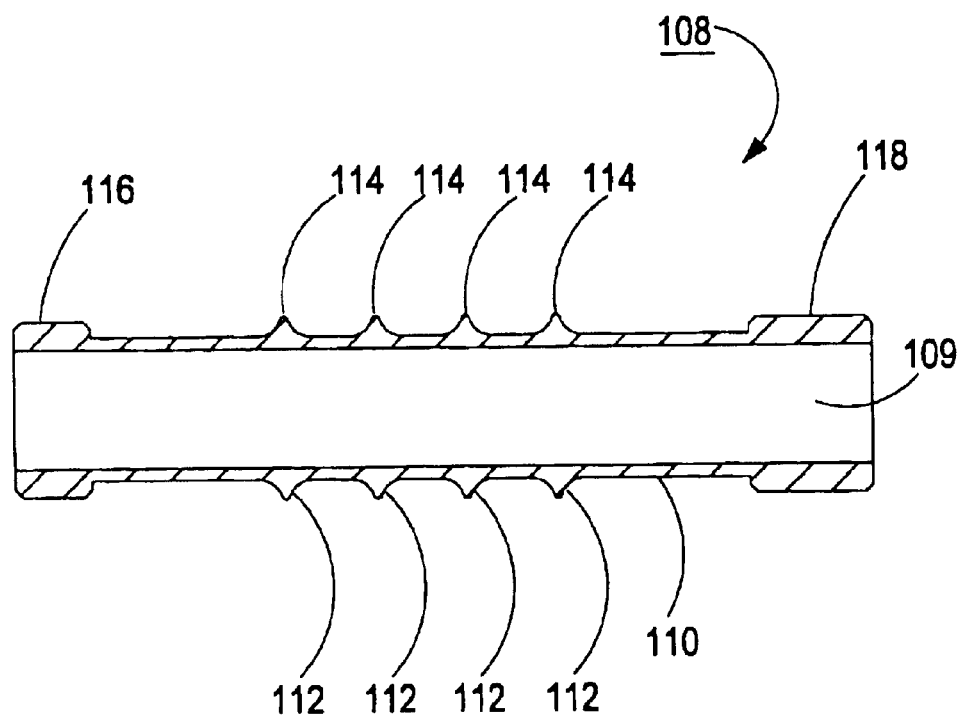
FIG. 6 is a cross-sectional view of the roller shown in FIG. 5A, taken along the line 6—6.

While it is customary that the pick-and-place head (not shown) is spring-loaded in a vertical direction to assure that it is not damaged when descending to pick up a component, an alternative embodiment further contemplates that roller 108, in either the configuration of FIG. 5A or 5B, may be supported by a resiliently mounted bushing or bearing for support of shaft 111. Such a feature would reduce the likelihood of damage were the pick-and-place head to descend too far when picking up the label.

Disposed in a vertical plane beyond the outermost roller 108 in platform 34 is a label sensor 36, preferably an optical or reflected infrared sensor for detecting the presence or absence of a label on the platform. The length of the roller bed in the direction of travel of a peeled label and the position of the sensor are selected such that as the trailing edge of the label leaves the liner, and therefore advancement of the label along the roller bed ceases, the leading edge of the label just eclipses the sensor.

Figure 11:
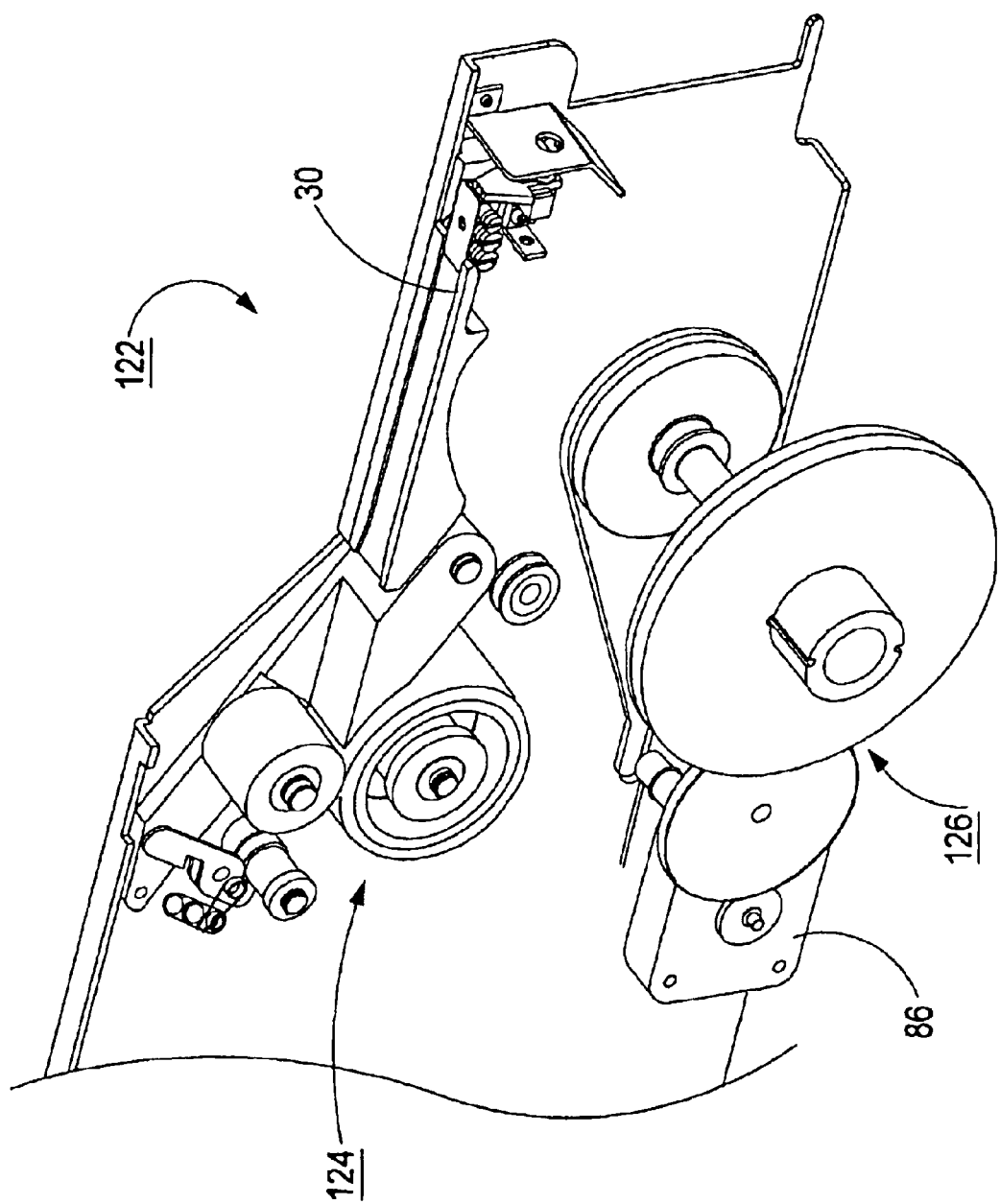
FIG. 11 is an isometric view of a portion of another embodiment of a label feeder in accordance with the invention, showing a tendency drive for drawing a ribbon of label liner through the feeder.

The tensioning, peeling, and drive portion of another embodiment 122 of a label feeder in accordance with the invention is shown in FIG. 11. A conventional friction clutch assembly 124 provides drag on the label liner ahead of peeler edge 30. The capstan drive module of embodiment 10 is replaced by a simple tendency-drive drive take-up 126. Drive motor 86' may be a stepper motor. Embodiment 10, however, is preferred because of positive drive of the label liner afforded by the capstan drive module, independent of the length of liner already unwound and wound. The spool of spent liner being wound on a winder continually increases in diameter that continually increases the torque needed to wind. At large spool diameters, a tendency drive take-up may have difficulty providing the torque needed both to wind spent liner and to provide liner tension at the peeler edge comparable to that attainable through a capstan drive module. In preferred embodiment 10, these two tasks are delegated to two separate conveyance elements, the winder 38 and the capstan drive module 32, respectively. Nonetheless, embodiments having liner conveyance and winding by tendency drive alone are envisioned and within the scope of the present invention.

Preliminary to operation of label feeder embodiment 10, door 60 on tensioner 28 and capstan roller nip 91 are both opened, and feeder 10 is loaded with a roll of linered label stock and threaded in accordance with FIG. 2. Door 60 and nip 91 are then closed. The feeder is docked via shoe 13 into a pick-and-place machine to which it is dedicated, and is electrically connected thereto via pin-type connector 45. An operator uses control buttons 46 to turn on the feeder, which initializes the controller, sets up the proper input and output lines, and advances the label liner to peel a label onto the roller bed.

Figure 12:
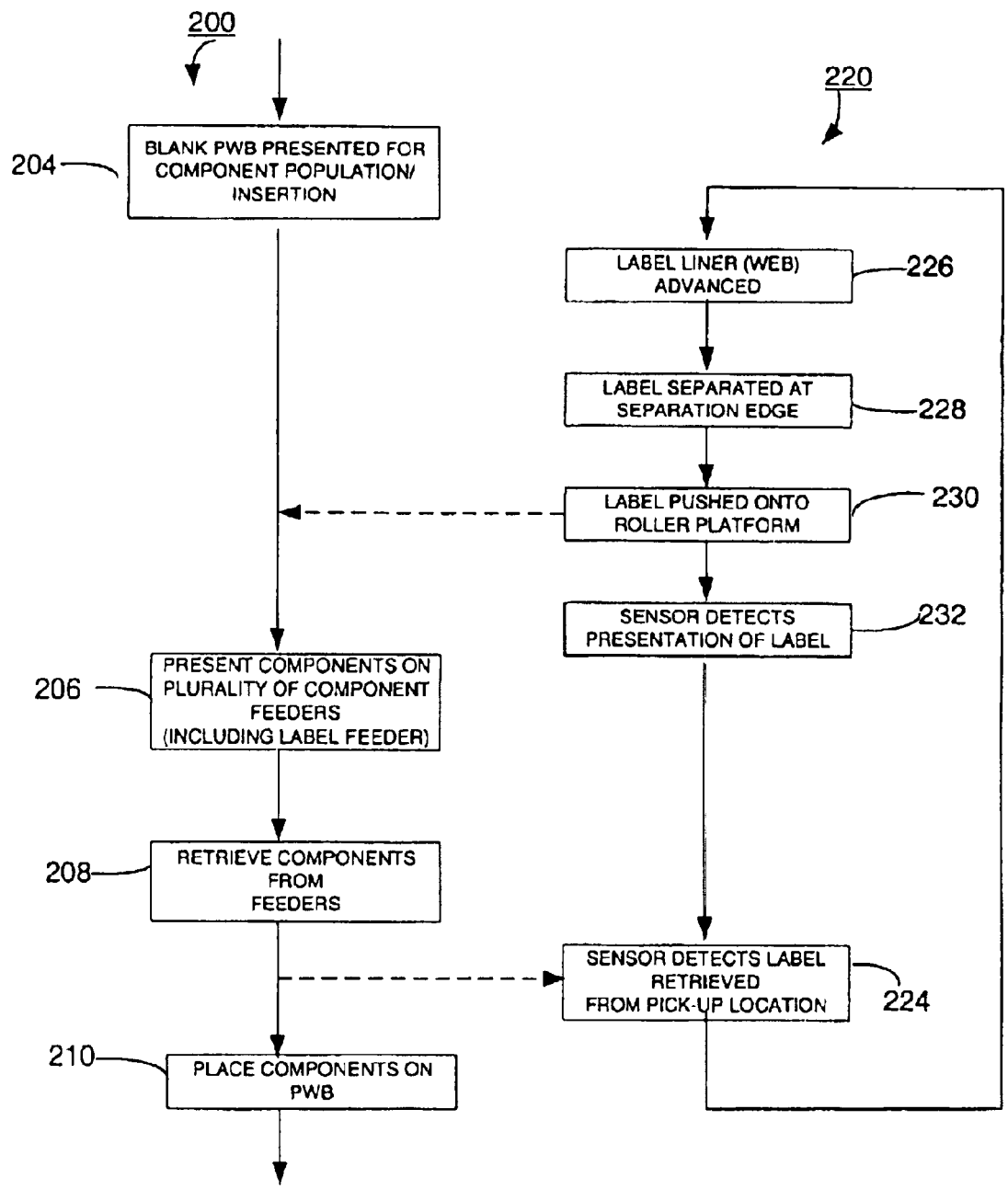
FIG. 12 is a flow chart depicting the various steps carried out by an embodiment of the invention.

Referring next to FIG. 12, the operation of feeder 10 will be described relative to the primary process steps depicted therein. As will be appreciated, the various component feeders operate based upon the cycle 200 of the SMT assembly system as depicted along the left side of the flowchart. In the SMT assembly system cycle, the processing cycle begins when a new printed circuit board (PCB) is presented for population with the SMT component (step 204). Next, components are presented to the system by a plurality of component feeders (including a label feeder), step 206. The pick-and-place head then retrieves the components from the component feeders at step 208 and places the components on the PCB at step 210. It will be appreciated that this cycle may be repeated numerous times in order to complete the population of the PCB.

Cycle 220 depicts the process for presenting a component such as a peeled label. Cycle 220 is initiated at step 224 when the sensor 36 signals the controller that the label on platform 34 has been removed. The controller signals the stepper motor to rotate through incremental steps, during which rotation via pinion gears 84 and 88 drives first and second capstan rollers 80 and 90 which have label liner 16 engaged therebetween. The capstan rollers are thereby driven to draw the tensed liner a distance equal to the distance between the leading edges of sequential labels on the liner (step 226). The next label on the liner ahead of the peeler edge 30 is thereby peeled from the liner (step 228) and simultaneously conveyed onto the platform 34 comprising rollers 108 (step 230). The stepper motor is stopped when the sensor signals to the controller that the new label is in place (step 232), completing the feed cycle. Error routines may also be provided in the controller to assist in diagnosing any operating anomalies.

In recapitulation, the present invention is a method and apparatus for high-precision label feeding, including a label feeder capable of dedicated feeding of adhesive-backed labels to a pick-and-place machine, wherein labels are peeled from a label liner by a peeler edge and are accurately advanced into position for vacuum retrieval from a nonadherable platform preferably comprising a plurality of undercut rollers. Variations and modifications of the herein described label feeder, in accordance with the invention, will undoubtedly suggest themselves to those skilled in this art. Accordingly, the foregoing description should be taken as illustrative and not in a limiting sense.

It is, therefore, apparent that there has been provided, in accordance with the present invention, a method and apparatus for the feeding of labels in a high-precision precision manner for retrieval by automated equipment. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

We claim:

1. A method of operating an assembly system to place labels on circuit boards assembled therein, comprising the steps of:

detecting that a label has been removed from a roller platform on a label feeder operatively associated with the assembly system;

in response to detecting that the label is removed for placement on a circuit board, initiating advancement of a tensioned label liner over a separation edge to cause a sequential label to be peeled from the label liner and pushed onto the roller platform adjacent to the separation edge;

detecting that the label is present on the roller platform;

in response to detecting the presence of the label on the platform, stopping the advancement of the tensioned label liner; and retrieving, during a single assembly cycle, at least one component from another component feeder in the assembly system.

2. A method for assembling a printed circuit board in an assembly system, including the steps or:

presenting a substrate to be populated with one or more components on a surface thereof;

presenting, on a plurality of component feeders operatively associated with the surface mount assembly system, components for retrieval at respective component pick-up locations;

automatically retrieving the components from said component feeders at the respective pick-up locations and placing the components on the surface of the printed circuit board;

wherein at least one of said component feeders is a label feeder for feeding a label on a label liner to the respective pick-up location for retrieval by the robot, and where said label feeder executes steps comprising separating the label from the label liner using a separator edge underlying the label liner; and receiving and supporting the separated label on a roller platform including a plurality of rollers, wherein at least two of said plurality of rollers include a plurality of circumferential ridges for supporting the label.

3. A method for providing a peeled, adhesive-backed label from a roll of linered label stock using a path for conveyance of the stock within a pick-and-place machine suitable for placing surface mount components, in order to provide the label for placement onto a circuit board, comprising the steps of:

advancing the label stock along said web path using label stock drive means oriented to fit within a conventional surface mount component feeding device location;

separating the label from the label liner using a separating edge underlying the label liner;

receiving the label on a platform including a plurality of ridged rollers, where said platform is positioned so as to be compatible with conventional component feeding devices in the pick-and-place machine and wherein the adhesive-backed surface of the label contacts the ridges of the rollers;

using a sensor, sensing the presence and absence of a separated label on said platform and communicating said presence and absence to said drive means;

in response to a label absence signal from said sensor, energizing said drive means to advance the label stock around said separating means to separate a label from said stock; and in response to a label presence signal from said sensor, de-energizing said drive means to arrest further advance of the label stock and signaling the de-energization of said drive means to the pick-and-place machine.

4. The method of claim 3, wherein the drive means includes a stepper motor operatively coupled to a pair of capstan rollers, and where the step of advancing the label stock comprises the step of energizing the stepper motor to rotate through incremental steps so as to cause the rotation of the capstan rollers that have the label liner engaged therebetween, until receiving a signal to stop driving the label liner in response to the label presence signal.

5. The method of claim 4, further comprising the step of crimping the label stock using meshing flutes on said pair of capstan rollers so as to positively drive the label liner through a roller nip between the pair of capstan rollers.

6. A method of operating a pick and place circuit board assembly system incorporating a programmable feeder to place labels on circuit boards during assembly, comprising the steps of:

acknowledging, in response to a sensor input, that a label has been removed from a roller platform on the programmable label feeder by a vacuum head of the pick and place circuit board assembly system;

initiating, in response to detecting that the label is removed, the advancement of a tensioned label liner over a separation edge to cause a subsequent label to be peeled from the label liner and pushed onto the roller platform located adjacent to the separation edge;

in response to detecting the presence of the subsequent label on the platform, stopping the advancement of the tensioned label liner; and communicating to the pick and place circuit board assembly system the availability of the subsequent label.

7. The method of claim 6, further comprising the step of retrieving, during a single assembly cycle, at least one electrical component from a component feeder within the pick and place circuit board assembly machine.

8. The method of claim 7, wherein an adhesive-backed label is separated from a roll of lined label stock, further comprising the steps of:

advancing the label stock along said web path using label stock drive means oriented to fit within a conventional pick and place circuit board assembly system component feeder bay;

receiving the label on a platform including a plurality of circumferentially ridged rollers, where said platform is positioned so as to be compatible with conventional component feeding devices in the pick and place circuit board assembly system and wherein the adhesive-backed surface of the label contacts ridges of the circumferentially ridged rollers; and in response to detecting the presence of the label on the platform signaling the availability of a label to the pick-and-place circuit board assembly system.

9. An assembly system, including:

means for presenting a circuit board to be populated with one or more components on a surface thereof;

a plurality of component feeders operatively associated with the assembly system, for presenting components at respective component pick-up locations;

a robot for retrieving the components from said component feeders at the respective pick-up locations and placing the components on the surface of the circuit board;

wherein at least one of said component feeders is a label feeder for feeding a label on a label liner to the respective pick-up location for retrieval by the robot, and where said label feeder comprises a frame, a separator presenting an edge underlying the label liner for separating the label from the label liner; and a roller platfom, including a plurality of rollers disposed on said frame for receiving and supporting the label, wherein at least two of said plurality of rollers include a plurality of circumferential ridges for supporting the label.

10. The assembly system of claim wherein the label is an adhesive-backed label, where the roller platform includes rollers facing the adhesive backing side of the label for receiving and supporting the adhesive side thereof, and where the circumferential ridges support the adhesive-backed label while reducing the adhesion of the label to the rollers.

11. A pick and place assembly system, including:

means for presenting a circuit board to be populated with components on a surface thereof;

a plurality of component feeders operatively associated with the pick and place assembly for presenting components at respective component pick-up locations;

an automated pick and place head for retrieving the components from said component feeders at the respective pick-up locations and placing the components on the surface of the circuit board;

wherein at least one of said component feeders is a programmable label feeder for feeding a label on a label liner to the respective pick-up location for retrieval by the pick and place head, and where said label feeder comprises a frame, a programmable controller a separator presenting an edge underlying the label liner for separating the label from the label liner; and a roller platform including a plurality of rollers disposed on said frame for receiving and supporting the label, wherein at least two of said plurality of rollers include a plurality of circumferential ridges for supporting the label; and where said label liner and associated labels are advanced under the control of the programmable controller in response to communications between said programmable controller and the pick and place assembly system.

12. The pick and place assembly system of claim 11, wherein the label is an adhesive-backed label, where the roller platform indudes rollers facing the adhesive backing side of the label for receiving and supporting the adhesive side thereof, and where the rollers have circumferential ridges to support the adhesive-backed label while reducing the adhesion of the label to the rollers.

* * * * *